United States Patent
Wang

(10) Patent No.: US 11,606,037 B2
(45) Date of Patent: Mar. 14, 2023

(54) DETECTION CIRCUIT AND SWITCHING CONVERTER

(71) Applicant: Silergy Semiconductor Technology (Hangzhou) LTD, Hangzhou (CN)

(72) Inventor: Longqi Wang, Hangzhou (CN)

(73) Assignee: Silergy Semiconductor Technology (Hangzhou) LTD, Hangzhou (CN)

( * ) Notice: Subject to any disclaimer, the term of this patent is extended or adjusted under 35 U.S.C. 154(b) by 82 days.

(21) Appl. No.: 17/146,621

(22) Filed: Jan. 12, 2021

(65) Prior Publication Data

US 2021/0226544 A1 Jul. 22, 2021

(30) Foreign Application Priority Data

Jan. 19, 2020 (CN) .......................... 202010059936.7

(51) Int. Cl.
*H02M 3/335* (2006.01)
*G01R 19/175* (2006.01)
*H02M 1/32* (2007.01)
*H02M 1/00* (2006.01)

(52) U.S. Cl.
CPC ...... *H02M 3/33576* (2013.01); *G01R 19/175* (2013.01); *H02M 1/32* (2013.01); *H02M 1/0009* (2021.05); *H02M 1/0025* (2021.05); *H02M 1/325* (2021.05)

(58) Field of Classification Search
CPC .. H02M 3/33576; H02M 1/32; H02M 1/0009; H02M 1/0025; H02M 1/325; G01R 19/175
See application file for complete search history.

(56) References Cited

U.S. PATENT DOCUMENTS

| | | | |
|---|---|---|---|
| 6,075,716 A | 6/2000 | He et al. | |
| 6,385,057 B1 | 5/2002 | Barron | |
| 8,471,488 B1 | 6/2013 | Hopkins et al. | |
| 9,077,260 B2 | 7/2015 | Zhao et al. | |
| 9,124,169 B2 | 9/2015 | Garlow et al. | |
| 9,525,336 B2 | 12/2016 | Huang | |
| 2007/0241727 A1* | 10/2007 | Luo | H02M 3/1588 323/272 |
| 2009/0243398 A1 | 10/2009 | Yohanan et al. | |
| 2015/0207398 A1 | 7/2015 | Proca | |
| 2015/0216007 A1 | 7/2015 | Ferrara et al. | |
| 2016/0036340 A1* | 2/2016 | Kikuchi | H02M 1/32 363/21.14 |
| 2021/0036621 A1* | 2/2021 | Perry | H02M 3/33576 |

FOREIGN PATENT DOCUMENTS

| | | |
|---|---|---|
| CN | 108093534 A | 5/2008 |
| CN | 104297553 A | 1/2015 |
| CN | 104297553 B | 9/2017 |

* cited by examiner

*Primary Examiner* — Rafael O De Leon Domenech

(57) ABSTRACT

A detection circuit for a switching converter, whereby: the detection circuit is coupled in parallel with an output capacitor of the switching converter, and is configured to provide a detection branch coupled in parallel with the output capacitor during a first period of a switching cycle, in order to detect an output voltage of the switching converter; and an output voltage detection signal is generated according to the detected output voltage during a second period of the switching cycle. A switching converter can include the detection circuit and an integrated circuit.

12 Claims, 5 Drawing Sheets

DETECTION CIRCUIT AND SWITCHING CONVERTER

RELATED APPLICATIONS

This application claims the benefit of Chinese Patent Application No. 202010059936.7, filed on Jan. 19, 2020, which is incorporated herein by reference in its entirety.

FIELD OF THE INVENTION

The present invention generally relates to the field of power electronics, and more particularly to detection circuits and switching converters.

BACKGROUND

A switched-mode power supply (SMPS), or a "switching" power supply, can include a power stage circuit and a control circuit. When there is an input voltage, the control circuit can consider internal parameters and external load changes, and may regulate the on/off times of the switch system in the power stage circuit. Switching power supplies have a wide variety of applications in modern electronics. For example, switching power supplies can be used to drive light-emitting diode (LED) loads.

DETAILED DESCRIPTION

Figure 1:
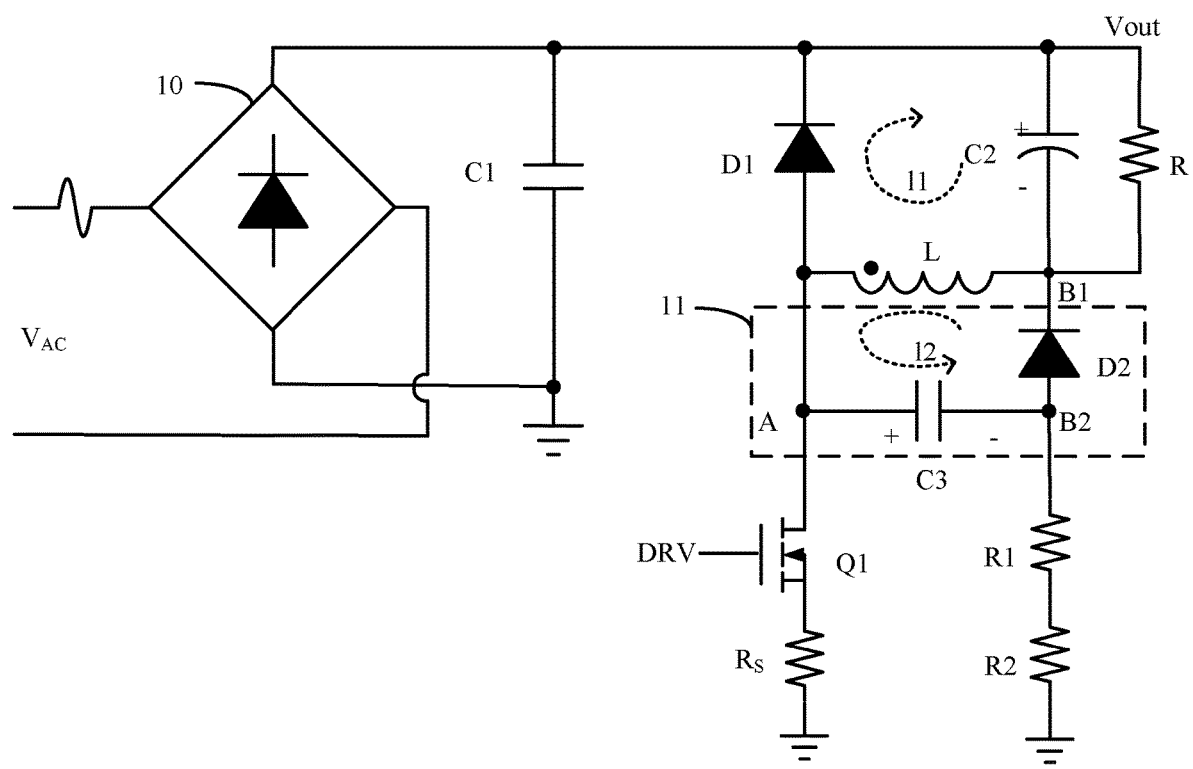
FIG. 1 is a schematic block diagram of a first example switching converter, in accordance with embodiments of the present invention.

Reference may now be made in detail to particular embodiments of the invention, examples of which are illustrated in the accompanying drawings. While the invention may be described in conjunction with the preferred embodiments, it may be understood that they are not intended to limit the invention to these embodiments. On the contrary, the invention is intended to cover alternatives, modifications and equivalents that may be included within the spirit and scope of the invention as defined by the appended claims. Furthermore, in the following detailed description of the present invention, numerous specific details are set forth in order to provide a thorough understanding of the present invention. However, it may be readily apparent to one skilled in the art that the present invention may be practiced without these specific details. In other instances, well-known methods, procedures, processes, components, structures, and circuits have not been described in detail so as not to unnecessarily obscure aspects of the present invention.

A switching converter is a power conversion circuit that can convert an input voltage into another fixed output signal, or an adjustable output signal through a different form of conversion circuit, and as a result is widely used in electronic products such as mobile devices. In practical applications, the switching converter usually needs to detect the output voltage of the switching converter in order to achieve constant voltage control or over-voltage protection. For example, the switching converter may generate an output voltage feedback value by sampling the output voltage, and control the switching state of the power switch of the switching converter according to the output voltage feedback value and a reference voltage to control the output voltage to maintain a desired value. In some approaches, the switching converter provides an auxiliary winding coupled to the magnetic element of the switching converter, and detects the output voltage of the switching converter by detecting the voltage across the auxiliary winding. However, in this approach, the introduction of the auxiliary winding can increase the control complexity, while also increasing the area and cost of the circuitry.

In one embodiment, a detection circuit for a switching converter, whereby: (i) the detection circuit is coupled in parallel with an output capacitor of the switching converter, and is configured to provide a detection branch coupled in parallel with the output capacitor during a first period of a switching cycle, in order to detect an output voltage of the switching converter; and (ii) an output voltage detection signal is generated according to the detected output voltage during a second period of the switching cycle. A switching converter including the detection circuit, can also include: (i) a power stage circuit configured to convert an input voltage in to an output voltage; (ii) a voltage divider circuit having an input terminal coupled to the detection circuit, and being configured to receive the output voltage detection signal to obtain a sampling value of the output voltage detection signal; and (iii) an integrated circuit having an input terminal coupled to an output terminal of the voltage divider for receiving the sampling value of the output voltage detection signal, and being configured to generate a corresponding control signal to control a state of the power stage circuit according to the sampling value of the output voltage detection signal.

Referring now to FIG. 1, shown is a schematic block diagram of a first example switching converter, in accordance with embodiments of the present invention. This example switching converter can include rectification circuit 10, input capacitor C1, and a power stage circuit. Rectification circuit 10 can receive and rectify input voltage $V_{AC}$ in order to generate a DC input voltage. Input capacitor C1 can connect in parallel to an output terminal of rectification circuit 10 in order to filter the DC input voltage. The power stage circuit can be configured as a BUCK topology, and may include diode D1 having a cathode that receives the DC input voltage. Power switch Q1 can include a first power terminal connected to an anode of diode D1, and a second power terminal coupled to a reference ground through sampling resistor Rs. Inductor L can include a first terminal connected to a common terminal of diode D1 and power switch Q1. Output capacitor C2 can connect to a cathode of diode D1 and a second terminal of inductor L, and which can provide output voltage Vout to load R.

In different control methods, a control circuit of the switching converter may generate a current sampling signal by detecting a current flowing through sampling resistor Rs, and can control the switching state of power switch Q1 according to the current sampling signal and a sampling value of output voltage Vout, in order to adjust output voltage Vout to meet a desired output voltage. It should be understood that although diode D1 is shown in FIG. 1, diode D1 can alternatively be any type of field-effect transistor, such as a metal-oxide-semiconductor field-effect transistor (MOSFET), or other types of field-effect transistors and/or any other types of transistors in certain embodiments. In addition, power switch Q1 may similarly be other types of transistors in certain embodiments.

This particular example switching converter can include detection circuit 11 coupled in parallel with output capacitor C2. In one example, input terminal A of detection circuit 11 can connect to the first terminal of inductor L, and output terminal B1 of detection circuit 11 can connect to a common terminal of the second terminal of inductor L and output capacitor C2. In a first period of a switching cycle, detection circuit 11 can provide a detection branch coupled in parallel with output capacitor C2, in order to detect output voltage Vout of the switching converter. In a second period of the switching cycle, the detection branch can essentially be disconnected without forming a discharge loop, and an output voltage detection signal may be generated at output terminal B2 of detection circuit 11 according to the detected output voltage. Here, the first time period and the second time period do not overlap each other, and the sum of a length of the first time period and a length of the second time period may not exceed the length of the switching cycle of the switching converter. Further, in the first time period, output capacitor C2 can provide a first current path for inductor L, and the detection branch can provide a second current path for inductor L. Since the first and second current paths are connected in parallel, the terminal voltages of the first and second current paths are equal, such that the output voltage of the switching converter can be detected.

In one embodiment, in the second time period, input terminal A of the detection branch can be coupled to a reference voltage to generate the output voltage detection signal at output terminal B2 of the detection branch. Here, the reference voltage can be set arbitrarily and is only used to fix the voltage at input terminal A of the detection branch, in order to obtain the voltage at output terminal B2 of the detection branch. In this embodiment, in order to facilitate circuit design, input terminal A of the detection branch can connect to the reference ground of the switching converter in the second time period.

In one embodiment, during the first time period, power switch Q1 may be turned off, and diode D1 can be turned on since inductor L appears the back electromotive force due to the energy released. Also, output capacitor C2 may provide the first current path for an inductor current flowing through inductor L, which can provide energy to output capacitor C2 and the load. Detection circuit 11 can include energy storage capacitor C3 that can provide a second current path for the inductor current and obtain the voltage across output capacitor C2 (e.g., output voltage Vout). In the second time period, power switch Q1 can be turned on, the DC input voltage can supply power to load R through inductor L, and inductor L may store energy. Input terminal A of detection circuit 11 can be coupled to the reference ground through sampling resistor Rs. Since the voltage across power switch Q1 and sampling resistor Rs is so small that it can essentially be ignored, the voltage at output terminal B2 of detection circuit 11 can be equal to the voltage across output capacitor C2 (e.g., output voltage Vout). In this embodiment, a voltage divider circuit may be applied to sample the voltage at second output terminal B2 to obtain a sampled value of the output voltage detection signal, in order to realize constant voltage control and over-voltage protection. For example, the voltage divider circuit can include resistors R1 and R2 connected in series between output terminal B2 and the reference ground. It should be understood that other voltage dividers that can implement the above functions are also applicable in certain embodiments.

In one embodiment, detection circuit 11 can include an energy storage capacitor C3 and a unidirectional conducting element to form the detection branch to detect the output voltage of the switching converter, where the unidirectional conducting element is diode D2. The first terminal of energy storage capacitor C3 can connect to the common node of inductor L and power switch Q1, the second terminal of energy storage capacitor C3 can connect to the anode of diode D2, and the cathode of diode D2 can connect to the common node of inductor L and output capacitor C2.

In the first time period, power switch Q1 can be turned off, since inductor L appears as back electromotive force due to the energy released, diodes D1 and D2 can be turned on. The inductor current can charge output capacitor C2 through current path 11, and charge output capacitor C3 through current path 12. In this way, the voltage across output capacitor C2 can be obtained through energy storage capacitor C3; that is, to obtain output voltage Vout of the switching converter. Since the conduction voltage drop of diodes D1 and D2 is relatively small and they can cancel each other out, the voltages across output capacitor C2 and energy storage capacitor C3 are essentially equal; that is, the voltage across energy storage capacitor C3 is equal to output voltage Vout.

In the second time period, power switch Q1 is turned on again, inductor L may store energy, diode D2 can be reversely biased, and detection circuit 11 may essentially be disconnected from inductor L, and no longer provides a current path for the inductor current. The first terminal of energy storage capacitor C3 can connect to the reference ground through power switch Q1 and sampling resistor Rs. Since the voltage across the power switch and the sampling resistor is so small as to essentially be ignored, the voltage at the second terminal of energy storage capacitor C3 can be directly detected, in order to obtain the output voltage detection signal. The switching converter can realize constant voltage control, overvoltage protection, etc., according to the output voltage detection signal. It should be understood that the unidirectional conducting element in this particular example is a diode, and a current path is provided for the inductor current through diode D2, and other circuit structures capable of realizing the above functions can be applied in certain embodiments. In this example, the energy of the energy storage capacitor itself is not consumed, so the system efficiency can accordingly not be reduced.

In one embodiment, detection circuit 11 can also include a sampling circuit for detecting a zero-crossing point of the current flowing through the magnetic element. Since the voltage on energy storage capacitor C3 is the same as the voltage across inductor L, when the energy in inductor L is released, the inductor current flowing through inductor L crosses zero at this time, causing its voltage to decrease, such that the sampling circuit can detect the first falling edge of the voltage at either terminal of energy storage capacitor C3, in order to detect the zero-crossing point of the inductor current. The switching converter can control the power switch according to the zero-crossing point of the inductor current.

In one embodiment, the sampling circuit can include a resistor divider network and a comparison circuit. The resistor divider network can detect the voltage at either terminal of energy storage capacitor C3 during the off-state of power switch Q1, and the comparison circuit can compare a detected voltage at either terminal of energy storage capacitor C3 against a voltage threshold to generate a current detection signal that characterizes when the inductor current crosses zero. When the detected voltage drops to the voltage threshold for the first time, the comparison circuit can generate an effective current detection signal. No more comparisons may be made during the rest of the switching cycle. In this embodiment, when the switching converter adopts synchronous rectification control, the switching converter can control an on-time of a synchronous rectifier switch according to the current detection signal to adjust output voltage Vout, thereby improving the conversion efficiency of the switching converter.

Particular embodiments may detect the output voltage of the switching converter by connecting the detection branch in parallel with the output capacitor of the switching converter during the first time period, and during the second time period the output voltage detection signal can be generated according to the detected output voltage. In addition, the detection of the zero-crossing point of the inductor current is realized. This detection method can eliminate auxiliary winding and other components, which may effectively simplify the circuit design and improve the system efficiency.

Figure 2:
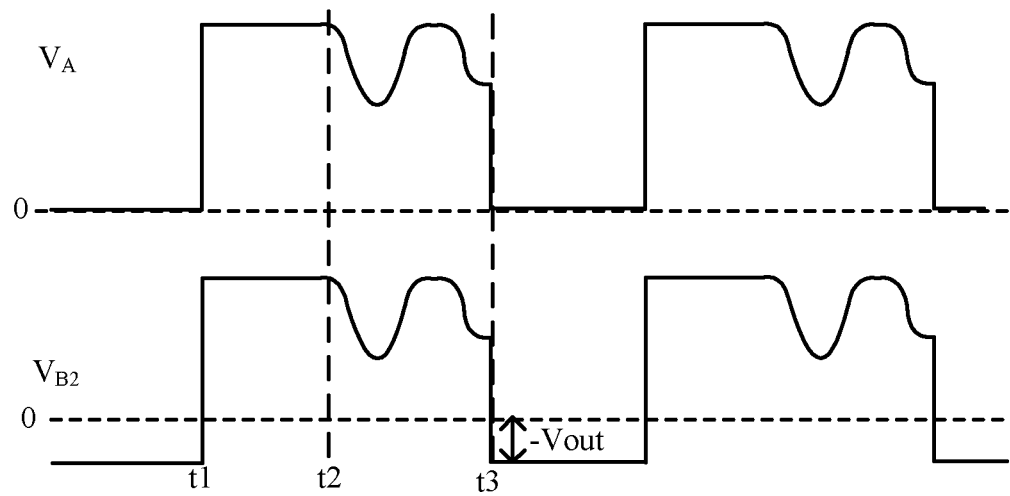
FIG. 2 is a waveform diagram of example operation of a switching converter, in accordance with embodiments of the present invention.

Referring now to FIG. 2, shown is a waveform diagram of example operation of a switching converter in accordance with embodiments of the present invention. In this particular example, voltages $V_A$ and $V_{B2}$ at input terminal A and output terminal B2 of the detection circuit, that is, the voltage at two terminals of energy storage capacitor C3, are respectively shown. Voltages $V_A$ and $V_{B2}$ may have the same changing trend. At time t1, power switch Q1 can be turned off, and a back electromotive force may appear due to the energy released of inductor L, so diodes D1 and D2 can be turned on. The inductor current may flow through output capacitor C2 and energy storage capacitor C3 respectively, the voltage across energy storage capacitor C3 can be equal to the voltage across output capacitor C2, and voltages $V_A$ and $V_{B2}$ may remain constant for a period of time. At time t2, the inductor current flowing through inductor L crosses zero, so voltages $V_A$ and $V_{B2}$ may no longer remain constant and begin to show a downward trend. At time t3, power switch Q1 can be turned on, the first terminal of energy storage capacitor C3 can be coupled to the reference ground through the power switch and the sampling resistor, voltage $V_{B2}$ at output terminal B2 may be equal to output voltage Vout, and the polarity of voltage $V_{B2}$ can be opposite to that of output voltage Vout, such that the output voltage detection signal can be obtained at output terminal B2, in order to realize constant voltage control or overvoltage protection. It can be seen from FIG. 2 that voltages $V_A$ and $V_{B2}$ at two terminals of energy storage capacitor C3 show a downward trend for the first time at time t2, so the zero-crossing point of the inductor current can be obtained by detecting the voltage at the terminal of energy storage capacitor C3.

Figure 3:
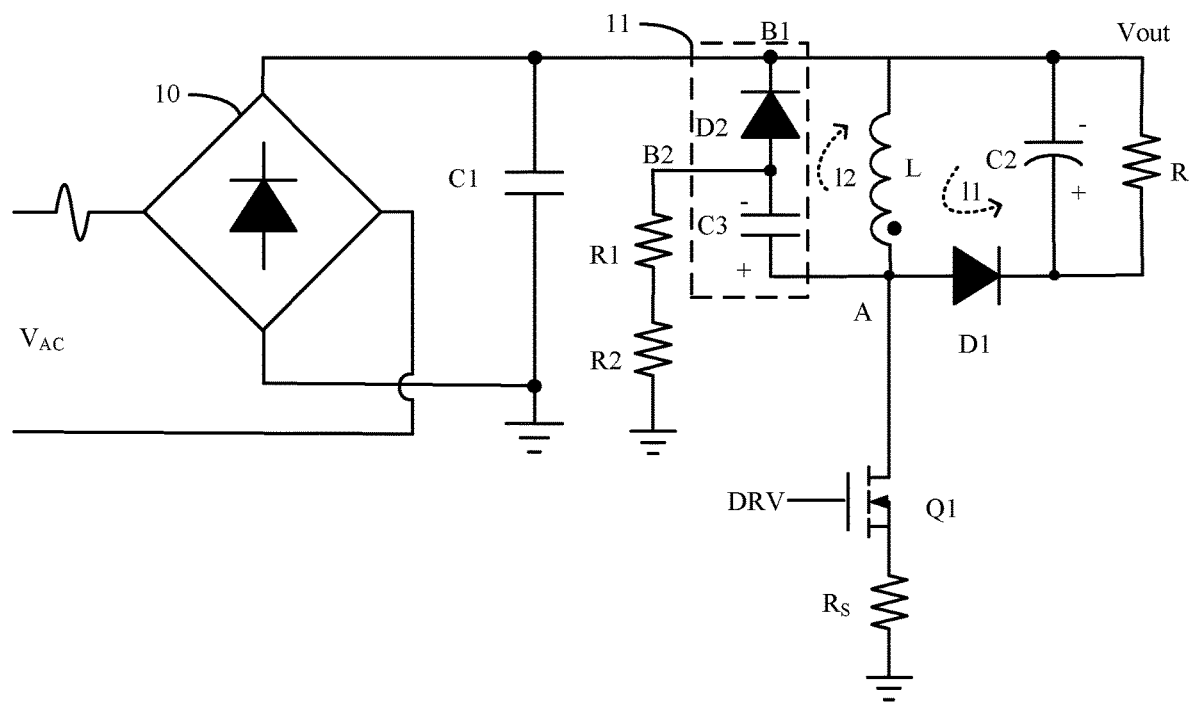
FIG. 3 is a schematic block diagram of a second example switching converter, in accordance with embodiments of the present invention.

Referring now to FIG. 3, shown is a schematic block diagram of a second example switching converter, in accordance with embodiments of the present invention. This particular example switching converter can include rectification circuit 10, input capacitor C1, and a power stage circuit. The difference from the example of FIG. 1 is that the power stage circuit here is a BUCK-BOOST topology, and magnetic element L, power switch Q1, and diode D1 form a new connection mode. The operating principle and structure of the detection circuit are substantially the same as those in the embodiment in FIG. 1, and will not be repeated here.

Figure 4:
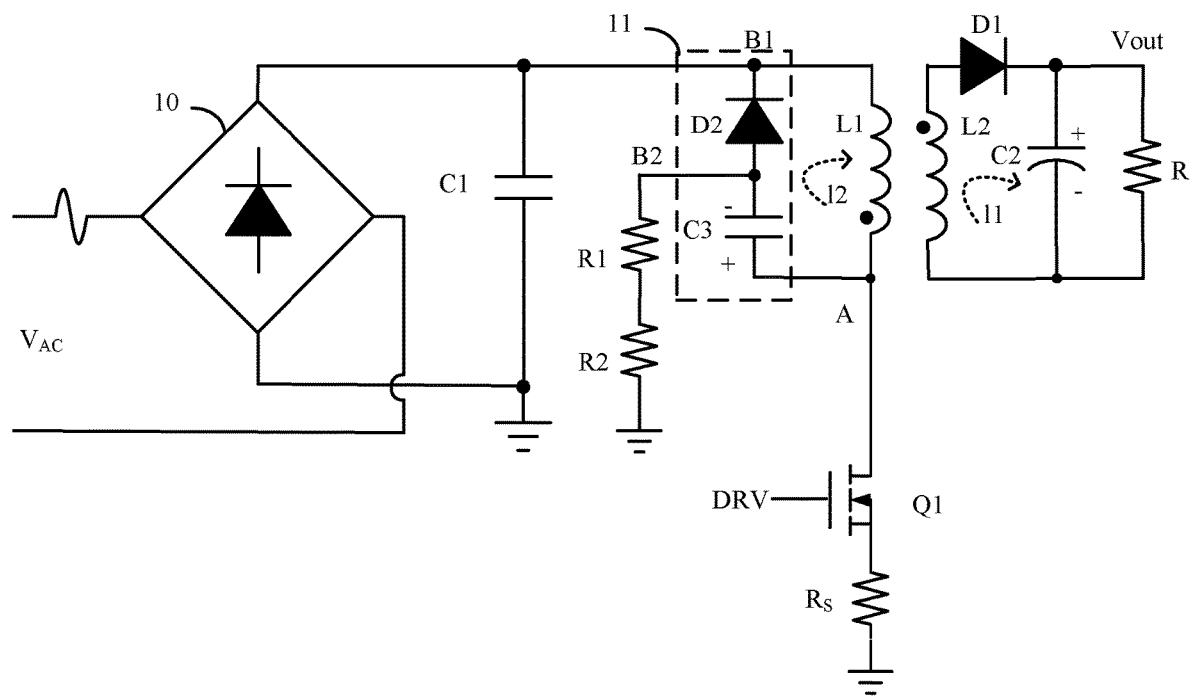
FIG. 4 is a schematic block diagram of a third example switching converter, in accordance with embodiments of the present invention.

Referring now to FIG. 4, shown is a schematic block diagram of a third example switching converter, in accordance with embodiments of the present invention. This particular example switching converter can include rectification circuit 10, input capacitor C1, and a power stage circuit. The difference from the example of FIG. 3 is that the power stage circuit in this embodiment is a FLYBACK topology. The magnetic element is a transformer, which includes primary winding L1 and secondary winding L2 coupled to each other. A first terminal of primary winding L1 can receive the DC input voltage, and a second terminal of primary winding L1 can connect to power switch Q1. A first terminal of secondary winding L2 can connect to an anode of diode D1, and a second terminal of secondary winding L2 can connect to the first terminal of output capacitor C2. The second terminal of output capacitor C2 can connect to a cathode of diode D1. The second terminal of primary winding L1 and the first terminal of the secondary winding L2 may form a dotted terminal. Detection circuit 11 can be coupled in parallel with primary winding L1, and may be coupled to output capacitor C2 through the transformer, in order to detect the output voltage of the switching converter.

In the first time period of a switching cycle, detection circuit 11 can provide a detection branch in parallel with output capacitor C2 to detect the output voltage of the switching converter, and in the second time period may generate an output voltage detection signal according to the detected output voltage. Further, in the first time period, power switch Q1 can be turned off, output capacitor C2 may provide current path l1 for secondary winding L2, the detection circuit 11 can provide current path l2 for primary winding L1, and energy storage capacitor C3 can detect a voltage across primary winding L1 when diode D2 is turned on. Since primary winding L1 and secondary winding L2 are coupled to form a mutual inductance winding, energy storage capacitor C3 can detect the voltage across secondary winding L2; that is, the output voltage across the capacitor C2, such that energy storage capacitor C3 can detect the output voltage of the switching converter by detecting the voltage across primary winding L1. In the second time period, power switch Q1 can be turned on, and the first terminal of energy storage capacitor C3 may be coupled to the reference ground through power switch Q1 and sampling resistor Rs. Since the voltage across the power switch and the sampling resistor is so small as to essentially be ignored, the voltage at output terminal B2 of detection circuit 11 can be equal to the voltage across output capacitor C2; that is, equal to output voltage Vout.

Figure 5:
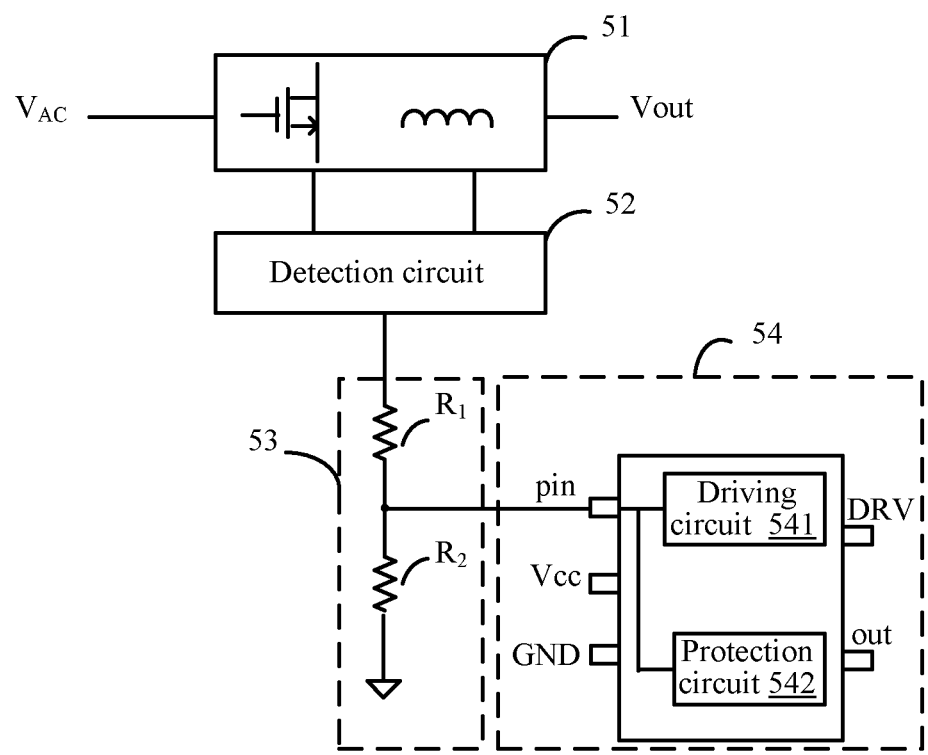
FIG. 5 is a schematic block diagram of a fourth example switching converter, in accordance with embodiments of the present invention.

Referring now to FIG. 5, shown is a schematic block diagram of a fourth example switching converter, in accordance with embodiments of the present invention. This example switching converter can include power stage circuit 51, detection circuit 52, voltage divider circuit 53, and integrated circuit 54. Power stage circuit 51 can be any suitable type of switching converter topology according to the different connection approaches of power switches, rectifiers, inductors, capacitors, etc., such as buck, boost-buck, forward, and flyback. In one embodiment, the power switch and/or rectification switch in power stage circuit 51 can also be integrated in integrated circuit 54. In this embodiment, the switching converter can also include the detection circuit in the above-mentioned embodiment for detecting output voltage Vout of the switching converter.

In one embodiment, voltage divider circuit 53 can connect to detection circuit 52 to receive the output voltage detection signal generated by detection circuit 52. An input pin "pin" of integrated circuit 54 can connect to an output terminal of voltage divider circuit 53 for receiving a sampling value of the output voltage detection signal, and may generate a corresponding control signal to control the operation state of power stage circuit 51 according to the sampling value of the output voltage detection signal.

In one embodiment, integrated circuit 54 can include driving circuit 541. Driving circuit 541 can generate driving signal DRV according to the sampled value of the output voltage detection signal, in order to control the switching state of the power switch in power stage circuit 51 to adjust a duty cycle of the power switch, such that output voltage Vout may be maintained at a desired value to achieve constant voltage control. For example, driving circuit 541 may generate driving signal DRV according to an error between the sampling value of the output voltage detection signal and a reference voltage representative of the desired value, and can control the switching state of the power switch according to driving signal DRV to realize the control for the duty cycle of the power switch, such that the output voltage of the power stage circuit maintains the desired value.

In one embodiment, integrated circuit 54 can include protection circuit 542. Protection circuit 542 can generate output signal "out" according to the sampled value of the output voltage detection signal, in order to control power stage circuit 51 to realize over-voltage or over-current protection. For example, protection circuit 542 can determine whether the output voltage is overvoltage based on a comparison result of the sampling value of the output voltage detection signal and a protection threshold. When the sampling value of the output voltage detection signal is greater than the protection threshold, this can indicate that the output voltage is in an overvoltage state. In this way, output signal "out" can cut off the energy transfer from an input terminal to an output terminal of power stage circuit 51 by controlling the switching state of the power switch of power stage circuit 51, thereby realizing overvoltage protection.

The embodiments were chosen and described in order to best explain the principles of the invention and its practical applications, to thereby enable others skilled in the art to best utilize the invention and various embodiments with modifications as are suited to particular use(s) contemplated. It is intended that the scope of the invention be defined by the claims appended hereto and their equivalents.

What is claimed is:

1. A detection circuit for a switching converter, the detection circuit comprising:
    a) wherein the detection circuit is coupled with an output capacitor of the switching converter, and is configured to provide a detection branch coupled in parallel with the output capacitor during a first period of a switching cycle, in order to detect an output voltage of the switching converter;
    b) wherein an output voltage detection signal is generated according to the detected output voltage during a second period of the switching cycle; and
    c) wherein the detection branch comprises an energy storage capacitor configured to obtain a voltage across the output capacitor that is proportional to the output voltage when the detection branch is conductive during the first period.

2. The detection circuit of claim 1, wherein a first terminal of the detection branch is coupled to a reference voltage, and the output voltage detection signal is generated at a second terminal of the detection branch during the second period.

3. The detection circuit of claim 2, wherein the first terminal of the detection branch is coupled to a reference ground of the switching converter.

4. The detection circuit of claim 1, wherein during the first period:
    a) the output capacitor is configured to provide a first current path for a magnetic element of the switching converter;
    b) the detection branch is configured to provide a second current path for the magnetic element; and
    c) voltages at terminals of the first and second current paths are equal.

5. The detection circuit of claim 1, wherein the output capacitor is coupled between output terminals of the switching converter.

6. The detection circuit of claim 1, wherein the detection circuit comprises:
    a) an energy storage capacitor having a first terminal coupled to a common node between a first terminal of an magnetic element and a power switch of the switching converter; and
    b) a unidirectional conducting element having a first terminal coupled to a second terminal of the energy storage capacitor, and a second terminal coupled to a second terminal of the magnetic element.

7. The detection circuit of claim 6, wherein:
    a) during the first period the unidirectional conducting element is turned on, and the energy storage capacitor is configured to obtain a voltage across the output capacitor; and
    b) during the second period the unidirectional conducting element is turned off, the first terminal of the energy storage capacitor is coupled to a reference ground of the switching converter, and the output voltage detection signal is generated at the second terminal of the energy storage capacitor.

8. The detection circuit of claim 6, further comprising a sampling circuit configured to detect the first falling edge of a voltage at the first or second terminal of the energy storage capacitor during the first period, in order to detect a zero-crossing point of a current flowing through the magnetic element.

9. The detection circuit of claim 4, wherein the magnetic element comprises a primary winding and at least one secondary winding, and the detection circuit is coupled in parallel with two terminals of the primary winding.

10. A switching converter, comprising the detection circuit of claim 1, and further comprising:
    a) a power stage circuit configured to convert an input voltage in to an output voltage;
    b) a voltage divider circuit having an input terminal coupled to the detection circuit, and being configured to receive the output voltage detection signal to obtain a sampling value of the output voltage detection signal; and
    c) an integrated circuit having an input terminal coupled to an output terminal of the voltage divider for receiving the sampling value of the output voltage detection signal, and being configured to generate a corresponding control signal to control a state of the power stage circuit according to the sampling value of the output voltage detection signal.

11. The switching converter of claim 10, wherein the integrated circuit comprises a driving circuit configured to generate a driving signal according to the sampling value of the output voltage detection signal, in order to control a switching state of a power switch in the power stage circuit to adjust a duty cycle of the power switch.

12. The switching converter of claim 10, wherein the integrated circuit comprises a protection circuit configured to control an operation state of the power stage circuit to realize overvoltage or overcurrent protection according to the sampling value of the output voltage detection signal.

\* \* \* \* \*